(12) United States Patent
Opperman

(10) Patent No.: US 8,854,246 B1
(45) Date of Patent: Oct. 7, 2014

(54) METHOD OF CONVERTING AN ELECTROMAGNETIC ANECHOIC TEST CHAMBER TO AN ELECTROMAGNETIC REVERBERATION TEST CHAMBER

(75) Inventor: Paul D. Opperman, Newport, RI (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 469 days.

(21) Appl. No.: 13/287,373

(22) Filed: Nov. 2, 2011

(51) Int. Cl.
*H01Q 17/00* (2006.01)

(52) U.S. Cl.
CPC .......... *H01Q 17/008* (2013.01); *H01Q 17/004* (2013.01)
USPC .................................. 342/4; 342/1; 342/165

(58) Field of Classification Search
CPC . H01Q 17/00; H01Q 15/0013; H05K 9/0086; H05K 9/0001
USPC .......................................... 342/1–5; 324/637
See application file for complete search history.

(56) References Cited

U.S. PATENT DOCUMENTS

| | | | | |
|---|---|---|---|---|
| 3,384,934 A | * | 5/1968 | Bush, Jr. | 24/303 |
| 4,384,435 A | * | 5/1983 | Polise et al. | 52/2.19 |
| 6,563,327 B1 | * | 5/2003 | Leferink | 324/637 |
| 2003/0198800 A1 | * | 10/2003 | Hoffman | 428/323 |
| 2011/0133977 A1 | * | 6/2011 | Park et al. | 342/1 |

OTHER PUBLICATIONS

Leferink, F., "In-situ high field strength testing using a transportable reverberation chamber," Electromagnetic Compatibility and 19th International Zurich Symposium on Electromagnetic Compatibility, 2008. APEMC 2008. Asia-Pacific Symposium on , vol., No., pp. 379,382, May 19-23, 2008.*

* cited by examiner

*Primary Examiner* — John B Sotomayor
*Assistant Examiner* — Marcus Windrich
(74) *Attorney, Agent, or Firm* — James M. Kasischke; Jean-Paul A. Nasser; Michael P. Stanley

(57) ABSTRACT

The invention is a method of converting an electromagnetic anechoic test chamber into an electromagnetic reverberation test chamber. Lightweight and flexible conductive fabric is used to cover (fully or partially) the radio frequency absorbing walls of an anechoic test chamber. The conductive fabric is strategically arranged and disposed across the interior of the anechoic test chamber by a variety of means including magnets and low-loss dielectric frames.

8 Claims, 3 Drawing Sheets

METHOD OF CONVERTING AN ELECTROMAGNETIC ANECHOIC TEST CHAMBER TO AN ELECTROMAGNETIC REVERBERATION TEST CHAMBER

STATEMENT OF GOVERNMENT INTEREST

The invention described herein may be manufactured and used by or for the Government of the United States of America for governmental purposes without the payment of any royalties thereon or therefore.

CROSS REFERENCE TO OTHER RELATED APPLICATIONS

Not applicable.

BACKGROUND OF THE INVENTION (1) Field of the Invention

The present invention relates to electromagnetic anechoic testing chambers, and more specifically to a method of converting an electromagnetic anechoic testing chamber to an electromagnetic complex cavity (or reverberation) testing chamber.

(2) Description of the Prior Art

Complex cavity radio frequency test techniques have been investigated for decades. These test techniques have been used to research real-world electromagnetic environments such as ship compartments, and have been integrated into compliance standards for electromagnetic compatibility, because of the robust nature of the testing and the strong correlation to real environments. The compliance testing utilizes a shielded, radio frequency reflective cavity to create a complex standing electromagnetic wave mode structure. The mode structure is "stirred" using one of a number of well-known methods, and the equipment being tested is subjected to a statistically known field over the course of the test. Presently, the testing chambers used for this compliance testing are constructed with the sole purpose of being used as reverberation chambers.

Electromagnetic compatibility standards also require radiated emissions and susceptibility testing to be performed in shielded anechoic chambers. These chambers are fully shielded from the outside electromagnetic environment and have radio frequency absorbing material placed on specific walls to reduce the amount of electromagnetic wave reflection within the chamber.

Due to the inherent nature of their respective designs, reverberation chambers cannot be substituted for anechoic chambers, and anechoic chambers cannot be substituted for reverberation chambers. Although both types of chambers are necessary for their respective testing purposes, it is rare for a single testing facility or research center to have both types of chambers due to the expense of constructing and maintaining them, as well as space limitations. There will be times when a facility that has an anechoic test chamber needs to perform complex cavity electromagnetic testing. What is needed in such a situation is a method to easily and temporarily convert an anechoic test chamber into a reverberation test chamber.

SUMMARY OF THE INVENTION

It is a general purpose and object of the present invention to provide a method for converting an anechoic test chamber into a reverberation test chamber.

This object is accomplished through the use of flexible conductive metalized fabric to temporarily and strategically cover the radio frequency absorbing material inside the anechoic test chamber in order to create the complex standing wave field required for the reverberation test chamber testing. The flexibility of the fabric allows the converted chamber to be loaded for specific purposes, as required by the specific test being performed, by being rolled or folded, thus exposing some of the radio frequency absorbing material intrinsic to the anechoic test chamber construction, yet still retaining the shielding integrity of the reverberation test chamber. A standard reverberation chamber would require extra absorbing material be brought into the chamber to perform the same loading. The field characteristics are adjusted by exposing the absorber on the wall by rolling or folding the fabric.

When installed, the flexible conductive metalized fabric reflects incoming electromagnetic waves and creates large variations in the magnitudes of constructive and destructive interference of the field in the chamber volume. The complex cavity test techniques take advantage of the interference created by the reflections. If the particular test required the field characteristics to be altered, then rolling and or folding the fabric to expose the absorbing material will cause less energy to be reflected and the field will change accordingly.

BRIEF DESCRIPTION OF THE DRAWINGS

Other objects, features and advantages of the present invention will become apparent upon reference to the following description of the preferred embodiments and to the drawings, wherein corresponding reference characters indicate corresponding parts throughout the several views of the drawings and wherein.

DETAILED DESCRIPTION OF THE INVENTION

Figure 1A:
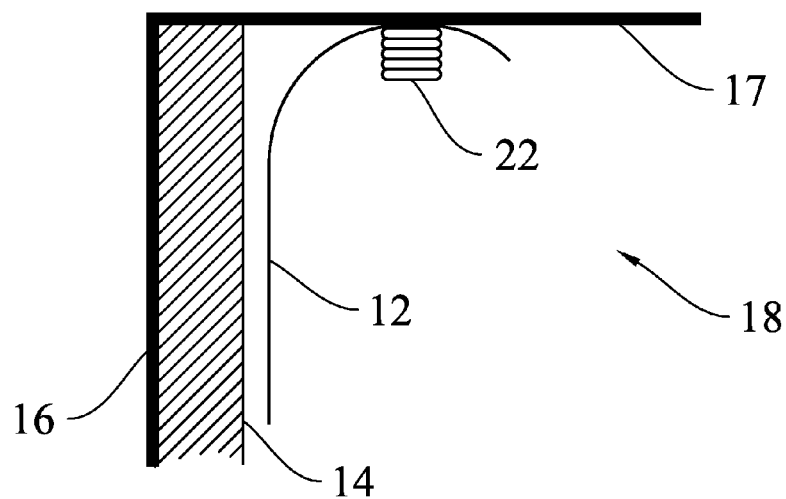
FIG. 1a illustrates apparatus to implement the conversion method of the present invention by use of magnets and conductive metalized fabric.
Figure 1B:
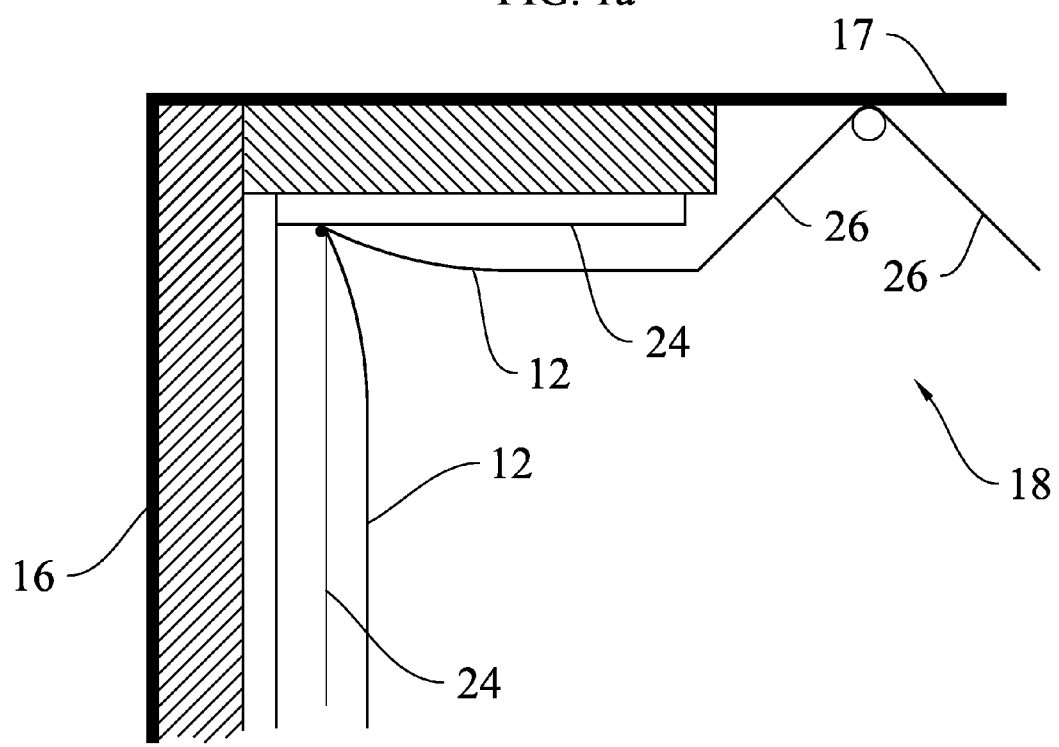
FIG. 1b illustrates apparatus to implement the conversion method of the present invention by use of low-loss dielectric frames or lines, and conductive metalized fabric.

The present invention teaches a method for converting an anechoic test chamber into a reverberation test chamber. Referring to FIGS. 1a, 1b, 1c and 2 there are illustrated exemplary diagrams of the apparatus to implement the conversion method 10 and a series of steps representing the conversion method 10 of the present invention. The method 10 requires sheets of conductive metalized fabric 12 to be strategically arranged in such a way as to cover all or portions of the radio frequency absorbing material 14 on the wall 16 of the anechoic test chamber 18. The conductive metalized fabric 12 must be lightweight, less than four ounces per square yard. The conductive metalized fabric 12 must be flexible enough to fold and roll as needed without damaging the fabric 12 itself, and have a sheet resistance of not more than one ohm per square yard. Examples of such a fabric 12 include Swift Textile Metalizing, LLC's Ni Ag coated Nylon Taffeta, or Ni Ag coated Nylon Ripstop. In a preferred embodiment, the exact material of the fabric is not specified or limited by the method, but rather is inherently limited by the weight and conductivity requirements.

Figure 1C:
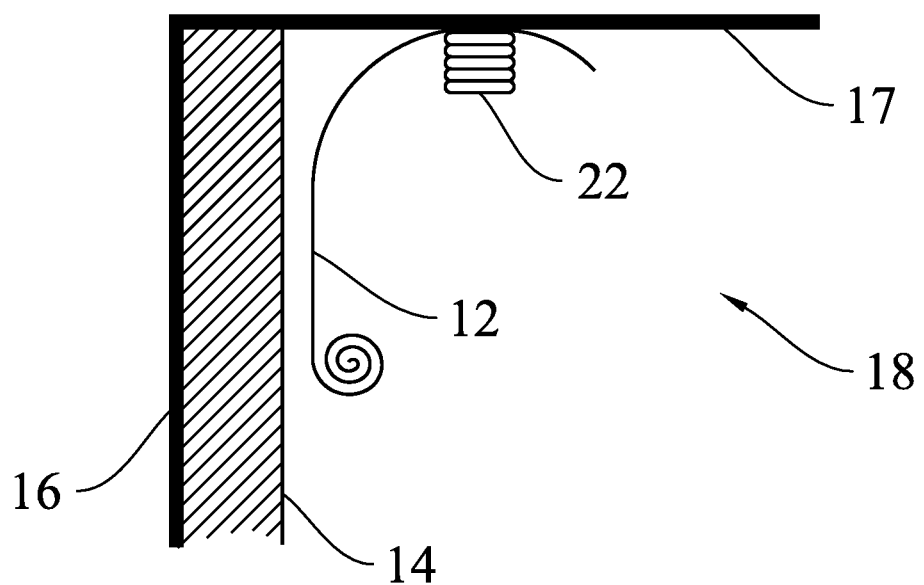
FIG. 1c illustrates a partial deployment of the conductive metalized fabric.
Figure 2:
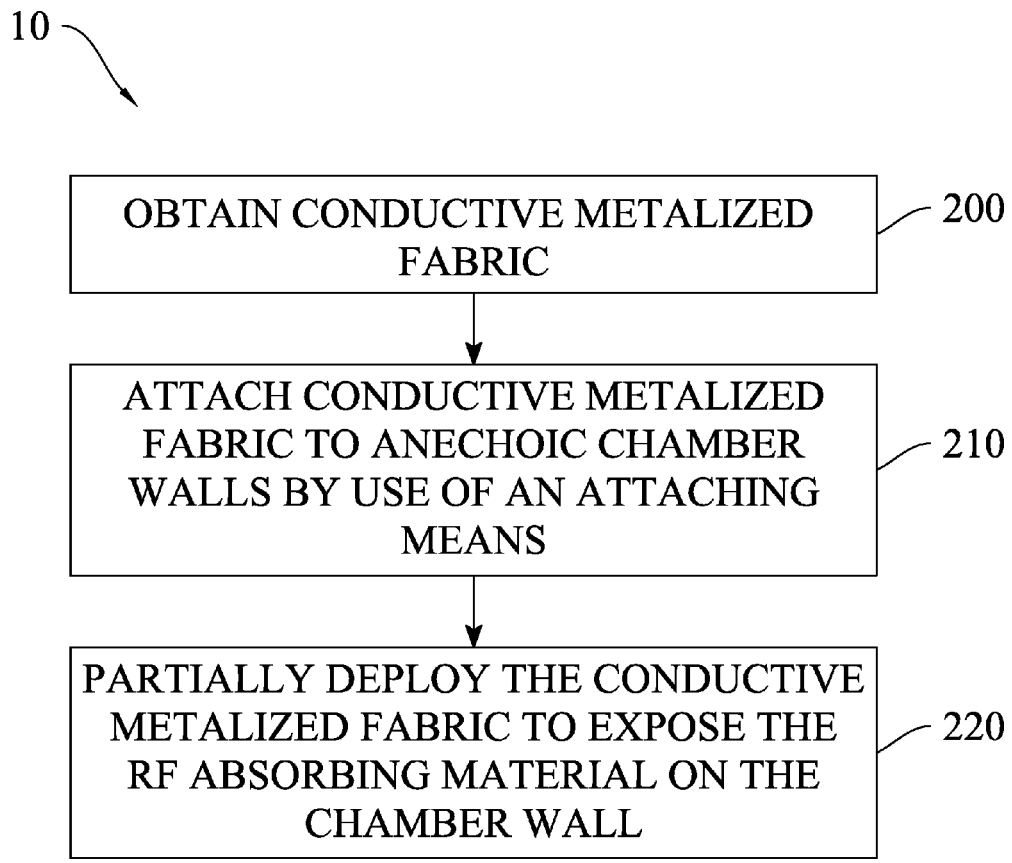
FIG. 2 illustrates a flow diagram of the steps of the conversion method of the present invention.

The first step 200 is to obtain the above-described conductive metalized fabric 12 in a sufficient quantity to cover all or portions of the radio frequency absorbing material 14 in the interior of the anechoic test chamber 18. The second step 210 is to employ an attaching means to attach the conductive metalized fabric 12 to the chamber walls 16 in such a way as to cover all or portions of the radio frequency absorbing material 14 on the wall 16 of the anechoic test chamber 18 with the conductive metalized fabric 12. In a preferred embodiment, the attaching means is one or more magnetic fasteners 22. The benefit of a magnetic fastener 22 is that it provides for the least amount of extra non-reflective material in the chamber 18, and is non-permanent to allow for easy removal. In an alternative embodiment, the attaching means is a low-loss dielectric frame 24 made of polyvinyl chloride for example and/or a low-loss dielectric line 26, such as a nylon line. In a further alternative embodiment, the fabric 12 is draped from the ceiling 17 of the anechoic test chamber 18 using the attaching means. The third step 220 is to partially deploy the conductive metalized fabric 12 (i.e., by rolling and/or folding the conductive metalized fabric 12 as illustrated in FIG. 1c) to strategically expose more of the radio frequency absorber material 14 already on the chamber walls 16, depending on the requirements of the particular test.

The advantage of the present invention is that this method allows the use of complex cavity test techniques in an anechoic chamber. Purpose built reverberation chambers are expensive, and require a large volume which is often difficult to find. This method provides a cost saving alternative to gain the benefits of both anechoic chambers and reverberation chambers.

In light of the above, it is therefore understood that within the scope of the appended claims, the invention may be practiced otherwise than as specifically described.

What is claimed is:

1. A method for converting an anechoic test chamber into a reverberation test chamber comprising:

providing a quantity of conductive metalized fabric sufficient to cover an interior of an anechoic test chamber, wherein said conductive metalized fabric is sufficiently flexible to be rolled and folded, wherein said conductive metalized fabric reflects electromagnetic waves;

attaching the quantity of conductive metalized fabric through the use of an attaching means to an interior of an anechoic test chamber for the purposes of covering said interior of the anechoic test chamber, wherein said interior of the anechoic test chamber has at least one surface of radio frequency absorbing material; and deploying the quantity of conductive metalized fabric in such a manner as to partially expose parts of said radio frequency absorbing material in said interior of the anechoic test chamber, wherein said partial exposure depends on the requirements of a particular complex cavity electromagnetic test.

2. The method of claim 1 wherein the conductive metalized fabric weighs less than four ounces per square yard and has a sheet resistance of not more than one ohm per square yard.

3. The method of claim 1 wherein the attaching means is a plurality of magnetic fasteners.

4. The method of claim 1 wherein the attaching means is at least one frame made of a low-loss dielectric material.

5. The method of claim 1 wherein the attaching means is a plurality of lines made of a low-loss dielectric material.

6. The method of claim 4 wherein the low-loss dielectric material is polyvinyl chloride.

7. The method of claim 5 wherein the low-loss dielectric material is nylon.

8. The method of claim 1 wherein deploying the quantity of conductive metalized fabric in such a manner as to partially expose parts of said interior walls of the anechoic test chamber involves folding or rolling up the conductive metalized fabric.

* * * * *